United States Patent [19]

Yamazaki et al.

[11] Patent Number: 5,007,374
[45] Date of Patent: Apr. 16, 1991

[54] APPARATUS FOR FORMING THIN FILMS IN QUANTITY

[75] Inventors: Shunpei Yamazaki, Tokyo; Shinji Imatou; Mitsunori Tsuchiya, both of Atsugi; Kenji Itoh, Zama; Takashi Inushima; Atsushi Kawano, both of Atsugi, all of Japan

[73] Assignee: Semiconductor Energy Laboratory Co., Ltd., Atsugi, Japan

[21] Appl. No.: 324,668

[22] Filed: Mar. 17, 1989

[30] Foreign Application Priority Data

Mar. 22, 1988 [JP] Japan ................................. 63-67572

[51] Int. Cl.$^5$ ............................................ C23C 16/50
[52] U.S. Cl. ................................... 118/723; 118/728; 427/39; 427/255.2
[58] Field of Search ....................... 118/723, 725, 728; 156/345, 643, 646; 204/192.12, 192.32, 298 C, 298 E, 298 EP, 298 TT; 427/38, 39, 255.2

[56] References Cited

U.S. PATENT DOCUMENTS

| | | | |
|---|---|---|---|
| 4,461,783 | 7/1984 | Yamazaki | 427/39 |
| 4,582,720 | 4/1986 | Yamazaki | 118/728 |
| 4,593,644 | 6/1986 | Hanak | 118/723 |
| 4,723,508 | 2/1988 | Yamazaki et al. | 118/723 |
| 4,808,553 | 2/1989 | Yamazaki | 427/39 |
| 4,828,668 | 5/1989 | Yamazaki et al. | 204/192.12 |
| 4,832,981 | 5/1989 | Yamazaki | 118/723 |

FOREIGN PATENT DOCUMENTS

| | | | |
|---|---|---|---|
| 58-10818 | 1/1983 | Japan | 118/723 |
| 59-127833 | 7/1984 | Japan | 118/723 |
| 59-136476 | 8/1984 | Japan | 118/723 |
| 60-224215 | 11/1985 | Japan | 118/723 |
| 60-224216 | 11/1985 | Japan | 118/723 |

*Primary Examiner*—Norman Morgenstern
*Assistant Examiner*—Terry J. Owens
*Attorney, Agent, or Firm*—Sixbey, Friedman, Leedom & Ferguson

[57] ABSTRACT

An apparatus suitable for mass-production of carbon coatings having a high degree of hardness. The apparatus utilized two types of energy input. First energy is inputted to a pair of electrodes provided in a reaction chamber, between which electrodes a deposition space is defined. A number of substrates to be coated are mounted on a plurality of substrate holders which are supplied with a second electric energy. The holders are arranged parallel to the electric field to prevent disturbance of the electric field.

6 Claims, 3 Drawing Sheets

APPARATUS FOR FORMING THIN FILMS IN QUANTITY

BACKGROUND OF THE INVENTION

This invention relates to apparatus for forming thin films in quantity, and more particularly relates to a plasma CVD apparatus which is suitable for mass-production.

Recently, ECR (Electric Cyclotron Resonance) CVD has attracted the interest of researchers as a new method of manufacturing thin films, particularly amorphous thin films. For example, Matsuo et al discloses one type of such ECR CVD apparatus in U.S. Pat. No. 4,401,054. This recent technique utilizes microwave energy to energize a reactive gas such that it develops into a plasma. A magnetic field functions to pinch the plasma gas within the excitation space. Within this excitation space, the reactive gas can absorb the energy of microwaves. A substrate to be coated is located distant from the excitation space (resonating space) for preventing the same from being spattered. The energized gas is showered onto the substrate from the resonating space. In order to establish electron cyclotron resonance, the pressure in a resonating space is kept at $1 \times 10^{-5}$ Torr at which pressure electrons can be considered as independent particles and resonate with the microwave energy in an electron cyclotron resonance on a certain surface on which the magnetic field strength meets the requirement for ECR. The excited plasma is extracted from the resonating space, by means of a divergent magnetic field, and is conducted to a deposition space which is located distant from the resonating space and in which there is disposed a substrate to be coated.

In such a prior art method, it is very difficult to perform carbon deposition of a polycrystalline or single-crystalline structure, so that currently available methods are substantially limited to processes for manufacturing amorphous films. Also, high energy chemical vapor reaction can not be readily accomplished by such a prior art and therefore it has not been possible to form diamond films or other films having high melting points, or uniform films on a surface having depressions and caves can not be formed. Furthermore, it was impossible to coat the surface of a super hard metal such as tungsten carbide with a carbon film. Because of this it is necessary to coat a super hard surface with a fine powder of diamond for use of abrasive which has a sufficient hardness and to make sturdy mechanical contact between the diamond powder and the substrate surface. Particularly, the throughput of substrates accommodated in one chamber is too low to apply for commercial base production.

SUMMARY OF THE INVENTION

It is therefore an object of the invention to provide an excellent plasma CVD apparatus for fabricating thin films.

It is another object of the present invention to provide a plasma CVD apparatus capable of forming excellent carbon films having a high adhesivity.

It is a further object of the present invention to provide an excellent plasma CVD apparatus suitable for mass production.

In order to accomplish the above and other objects and advantages, first AC electric energy is applied 1 to 50 MHz to a pair of electrodes in a CVD chamber in order to generate plasma gas therebetween. Second AC energy on the other hand is applied to a substrate at 1 to 500 KHz for collecting excited gas and eliminating undesirable charge stored thereon. A number of substrates are mounted on a plurality of substrate holders which are provided between the pair of electrodes in the reaction chamber. The substrate holders are arranged parallel to the electric field induced by the electrodes in order not to provoke the disturbance of the electric field between the electrodes. The reactive gas used may be, for example, a hydrocarbon such as $C_2H_2$, $C_2H_4$, $C_2H_6$, $CH_3OH$, $C_2H_5OH$ or $CH_4$ and a halogen compound gas such as $CF_4$, $C_2F_2$, $C_2F_4$, $C_2Cl_2$ or $C_2Cl_4$. By this process, insulating carbon films having an energy gap not lower than 1.0 eV, e.g., 1.5 to 5.5 eV can be deposited. When silicon nitride films are deposited in accordance with the present invention, the resistivity thereof ranges from 1.7 ohm centimeter to 2.0 ohm centimeter. The etching rate of the silicon nitride films using HF is 2 to 10 Å/sec, while those of silicon nitride films deposited by prior art methods are on the order of 30 Å/sec.

DETAILED DESCRIPTION OF THE PREFERRED EMBODIMENTS

Figure 1:
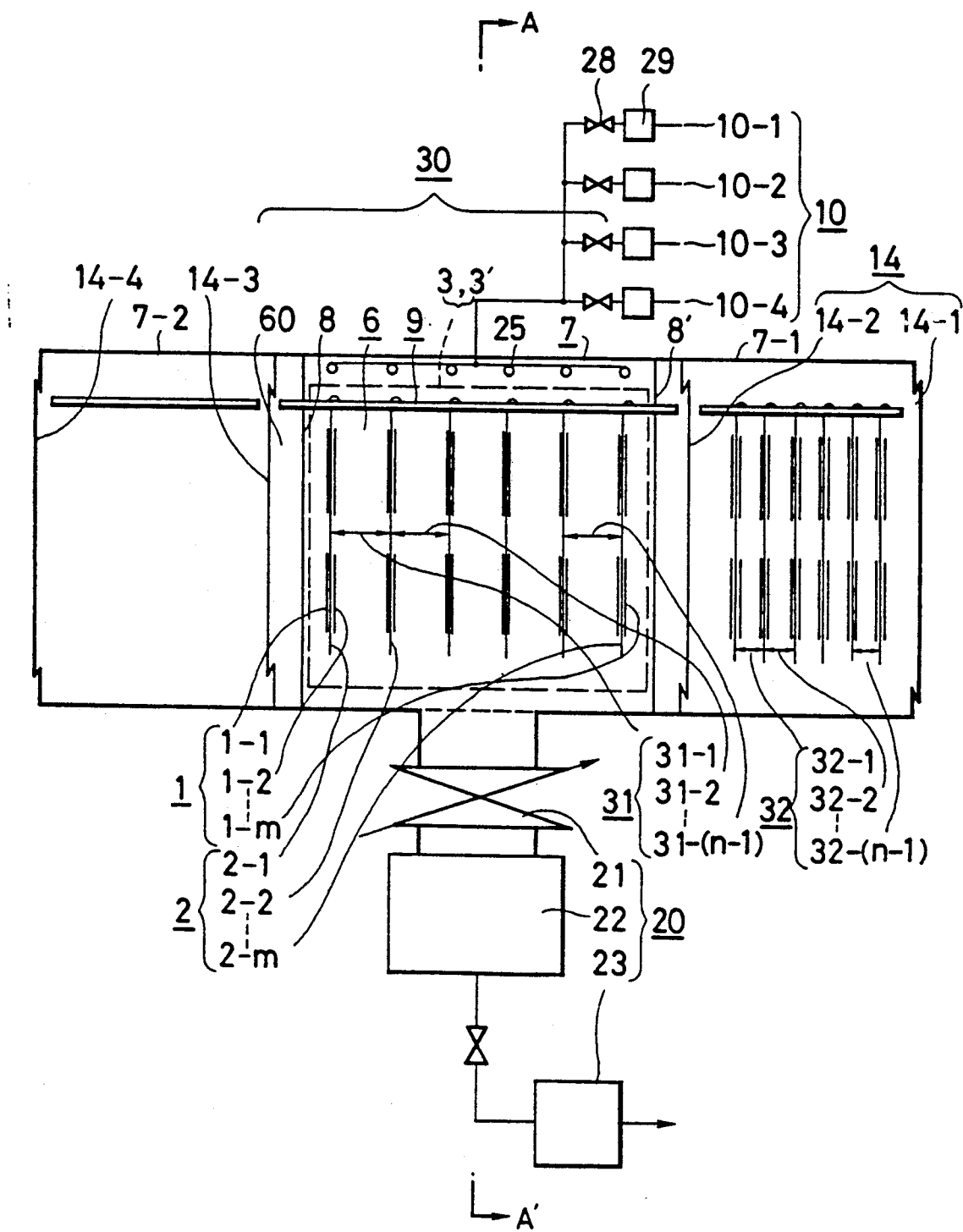
FIG. 1(A) is a cross section view showing a plasma CVD apparatus in accordance with the present invention.
FIG. 1(B) is a cross section view taken along A—A line of FIG. 1(A).
Figure 1:
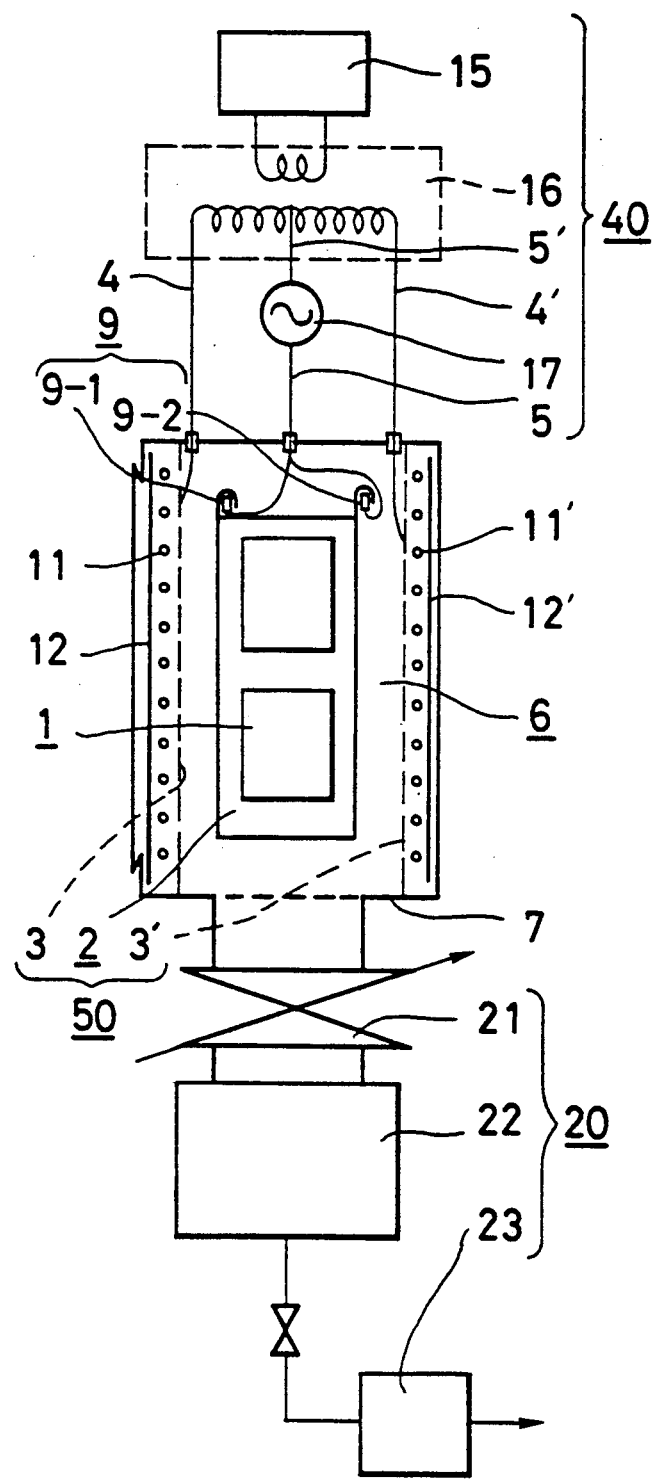

Referring to FIGS. 1(A) and 1(B), a plasma CVD apparatus in accordance with the present invention will be described. A large size plasma treatment system comprises a reaction chamber 7 provided with a loading chamber 7-1, an unloading chamber 7-2, a pair of guide rails 9 for suspending therefrom a plurality of substrate holders 2 made of aluminium or nickel plates, a high frequency electric power source 15 for supplying an electric power through a matching transformer 16, first and second metallic mesh electrodes 3 and 3' connected to the output terminals 4 and 4' of the transformer 16, the geometric area of each electrode being 150 cm$^2$ and the effective area of each electrode being 120 cm$^2$, an alternating electric power source 17 connected between the midpoint of the secondary coil of the transformer and the guide rails 9, a gas feeding system 10 consisting of four passages each of which is provided with a flow meter 29 and a valve 28, a nozzle 25 for inputting gases to the reacion chamber 7 from the gas feeding system 10, and an exhausting system 20 including a pressure control valve 21, a turbo molecular pump 22 and a rotary pump 23. A reaction space is defined within the reaction chamber by a four-sided hollow structure 8 and 8' of 160 cm width, 40 cm depth and 160 cm height for blocking deposition on the inside wall of the reaction chamber 7. The height of the hollow structure may be chosen between 20 cm and 5 m in general. One dimension of the electrodes 3 and 3' may be chosen between 30 cm and 3 m in general. There are provided gate valves 14-1 and 14-4 between the outside and the loading and unloading chambers 7-1 and 7-2 and gate valves 14-2 and 14-3 between the reaction chamber 7 and the loading and unloading chambers 7-1 and 7-2 for sealing off. The inside of the reaction chamber 7 is provided with a heater consisting of a plurality of halogen lamps 11 and 11' and reflection plates 12 and 12' behind the lamps.

A plurality of substrates 1-1, 1-2, ... 1-n are mounted on the plurality of substrate holders 2-1, 2-2, ... 2-n. The distances 31-1, 31-2, ... between each of the adjacent holders in the reaction chamber 7 are selected substantially constant, the dispersion from the average being within ±20%. The corresponding distances in the loading chamber are selected more narrower for the purpose of designing the system compact. In this arrangement, only one side surface of each substrate is coated. If coating of both surfaces is desired, the substrates are supported in openings formed on the holders. Introduced to the reaction chamber 7 are a carrier gas of argon or hydrogen from the passage 10-1 of the gas feeding system, a reactive gas of a hydrocarbon such as methane or ethylene from the passage 10-2 and a halogen compound gas such as $NF_3$ from the passage 10-3. The pressure of the reactive gas is 0.001 to 1.0 Torr, e.g. 0.05 Torr. The substrate temperature is $-100°$ C. (in case with a cooling system) or up to 150° C.

A first alternating voltage is applied between the mesh electrodes 3 and 3' at a high frequency of 1 MHz to 5 GHz, e.g. 13.56 MHz while a second alternating voltage is applied between the midpoint of the secondary coil and the rails 9 at a frequency of 1 KHz to 500 KHz, e.g. 50 KHz. The input power of the first alternating voltage is 1.0 KW to 30 KW (equivalent to a plasma energy of 0.04-1.3 $KW/cm^2$), e.g. 10 KW (equivalent to a plasma energy of 0.44 $W/cm^2$). The second alternating voltage functions to apply an AC bias voltage of $-200$ to 600 V (equivalent to 500 W) at the substrate surface. By virtue of this electric power, a plasma gas is generated in the reaction chamber 7 and initiates chemical vapor reaction. The exhausted gas is removed through the evacuation system 20.

In operation of the apparatus, carbon coatings were deposited. First, argon gas was introduced into the reaction chamber at 0.05 Torr, followed by inputting high frequency energy between the mesh electrodes 3 and 3' at 110 KW from the power source 15 and between the transformer 16 and the substrate holders 2 in order to effect sputtering action until the substrate temperature reached 100° to 500° C. Then, methane was continuously introduced in order that methane gradually substituted for and finally replaced all amount of argon. As a result, carbon coatings (amorphous or crystals) were obtained. The Vickers Hardness was measured to be not lower than 2000 $Kg/mm^2$. The thermal conductivity was measured not lower than 2.5 W/cm deg. The deposition speed was 100 to 1000 Å/min, e.g. 100 to 200 Å/min. In the case of the deposition of coatings having a thickness of 1 micron at the centers of the substrates, disparity of the thickness was up to 10%. Also, physical properties such as hardness were substantially uniform.

With these deposition conditions, the carbon coating processing was repeated while the pressure in the chamber and the distance between adjacent substrate holders were changed. As a result, the deposition speed and the disparity of the coatings were measured as specified in the following table.

TABLE

| Pressure (Torr) | 0.01-0.03 | 0.03-0.07 | 0.07-0.1 |
|---|---|---|---|
| CASE A | 10-30 Å/min < ±5% | 30-70 Å/min < ±10% | 70-200 Å/min ≦ ±20% |
| CASE B | 50-100 Å/min < ±7% | 100-200 Å/min < ±10% | 200-500 Å/min ≦ ±20% |
| CASE C | 50-150 Å/min < ±7% | 200-300 Å/min < ±10% | 300-600 Å/min ≦ ±20% |

In the above table, the distance between adjacent substrate holders was 2-5 cm in Case A, 5-10 cm in Case B and 10-15 cm in Case C. The numbers of the holders arranged in the chamber at once were 72-24 in Case A, 24-12 in Case B and 12-18 in Case C respectively. In accordance with our experiments, the suitable distance is 5-10 cm, e.g. 8 cm in which case 15 holders can be arranged. The distance can be more short, e.g. 0-2 cm in the load or unload chamber. The deposition speed was 10 to 600 Å/min, for example, 100 to 200 Å/min at 0.03 to 0.07 Torr. The disparity of coatings was within ±10%. 24 to 12 holders could be accommodated in the reaction chamber.

Next, a final coating is formed on a silicon semiconductor wafer within which semiconductor devices are formed in order to define a plurality of IC chips. After providing Al wiring on the wafer, a silicon oxide film is deposited to a thickness of 0.3 to 1 micrometer by use of the apparatus shown in FIGS. 1(A) and 1(B). A carbon coating is then deposited to a thickness of 0.1 to 1 micrometer on the silicon oxide film. Furthermore, the upper surface of the carbon film is covered with an organic photoresist pattern. Then, the carbon film and the silicon oxide film are selectively removed by use of HF etchant in order to expose the boding pads of the wiring. The organic resist is removed by oxygen or a suitable oxygen compound as an etchant.

In the same manner, it is possible to deposit silicon nitride films using silane and ammonia, boron nitride films using diborane and ammonia, titanium nitride films using organic titanium and nitrogen, aluminum films using methyl alcohol.

Figure 2:
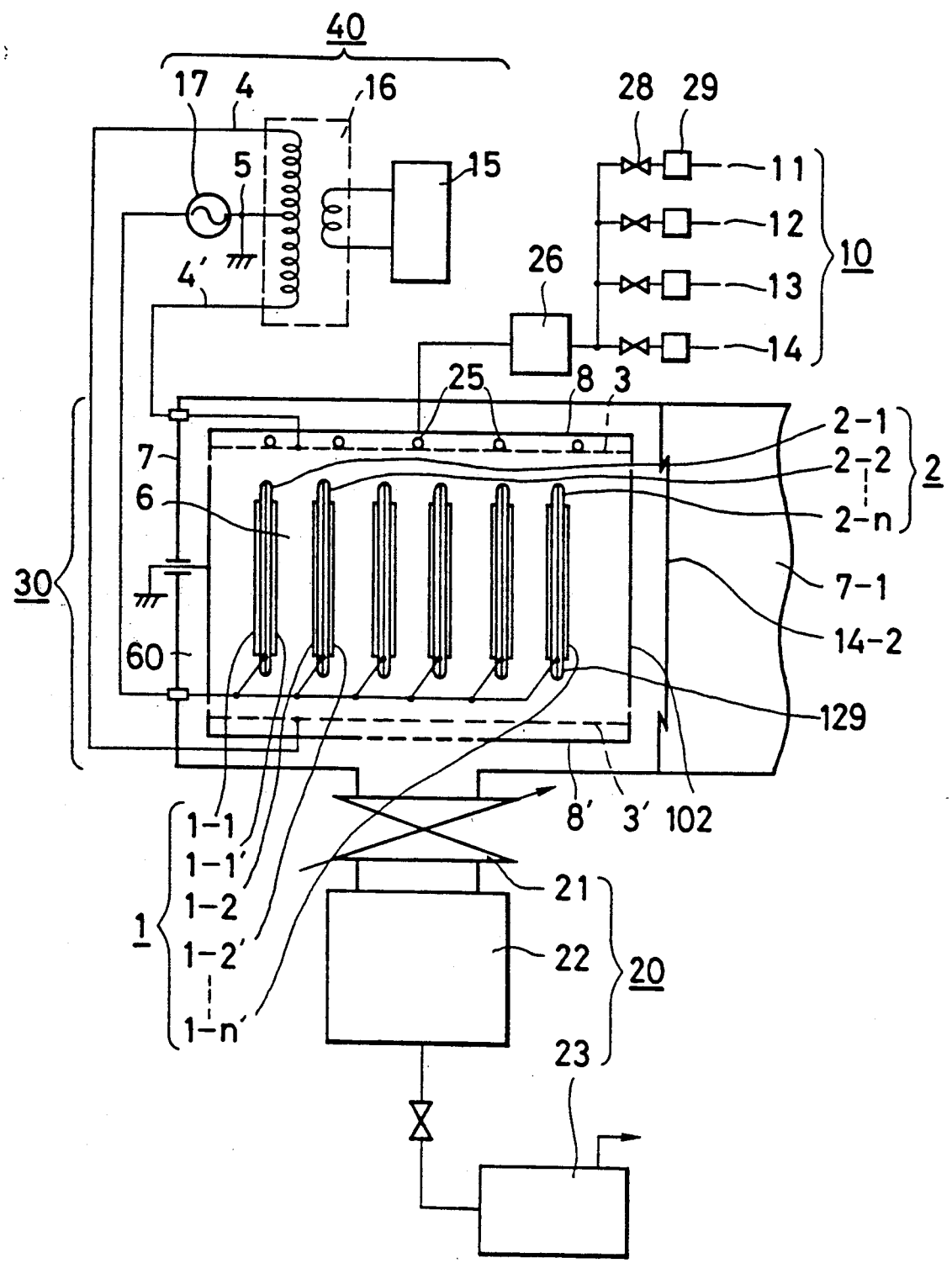
FIG. 2 is a cross section view showing another plasma CVD apparatus in accordance with the present invention.

Referring to FIG. 2, another embodiment is illustrated. The apparatus shown in FIG. 2 is constructed on the basis of the same conception as the previous embodiment. Like numerals are given to like parts appearing the figures of both embodiments and redundant explanation will not be repeated.

In contrast to the previous embodiment, Al mesh electrodes 3 and 3' are provided above and below substrates 1 to be coated. The substrates 1 are mounted on a plurality of substrate holders 2 which are coated with alumina films 129 by alumite treatment. The alumina films insulate the substrates from the substrate holders 2. Alternating current, however, can pass through the alumina films. Two substrates are mounted on both sides of each holder 2. Enclosing the substrate array, circular or rectangular cylinder 102 is provided. The height of the rectangular cylinder is in the range of 20-100 cm, and may be, for example, 40 cm. The width of the rectangular cylinder is in the range of 30-300 cm, and may be, for example, 80 cm. The length of the rectangular cylinder is in the range of 30-300 cm, and may be, for example, 80 cm. The upper and lower openings of the cylinder are closed by lids 8 and 8' in which the electrodes 3 and 3' are fixed. A high frequency power source 15 and an alternating power source 17 are of the same structure as those of the previous embodiment. The alternating power source 17 is connected between the substrate holders 2 and the ground 5.

In operation, after evacuating the reaction chamber 7, reactive gas is leaked into the chamber from the gas feeding system 10 through the valves 25. The pressure of the reactive gas in the reaction chamber is 0.001 to 1.0 Torr, e.g. 0.05 Torr. The temperature of the substrates 1 is kept, by a suitable temperature controller (not shown), at $+450°$ to $-100°$ C.. To the reaction space 6, electric energy is applied from the power sources 15 and 17. The first electric energy from the power source 15 is applied between the electrodes 3 and 3' at 1 to 100 MHz, e.g. 13.56 MHz and 0.5 to 5 KW (equivalent to 0.3 to 3 W/cm), e.g. 1 W (equivalent to 0.6 W/cm). The second electric energy from the power source 17 is applied to the substrate holders 2 at 1 to 500 KHz, e.g. 50 KHz and 100 to 1000 W, e.g. 500 W. The amplitude of the alternating energy outputted from the power source 17 is 300 to 1000 V. A self-bias voltage of $-200$ to $-600$ V appears at the substrate holders 2 during the energy application. This system is also suitable for forming carbon coatings having a high degree of hardness. In accordance with experiments, the deposition speeds were 100 to 200 Å/min in case of the use of methane and 500 to 1000 Å/min in case of the use of ethylene. The Vickers Hardness and the thermal conductivity were measured not lower than 2000 Kg/mm$^2$ and not lower than 2.5 W/cm deg respectively.

Silicon nitride films were deposited on a plurality of substrates 1 in the apparatus shown in FIG. 2. The substrates were silicon wafers in which were formed a plurality of chips consisting of integrated circuits. The silicon nitride films were intended to be final coatings of the wafers. The reactive gas consisted of $Si_2H_6$, ammonia and a carrier gas of nitrogen at a volume ratio of 1:3:5. After introduction of the reactive gas at 0.05 Torr, first and second energies from the power sources 15 and 17 were inputted between the electrodes 3 and 3' and to the substrate holders 2 at 13.56 MHz and 800 W and at 50 KHz and 500 W respectively. The amplitude of the second energy was 750 V. The self-bias voltage at the substrate holders was $-130$ V. As a result, silicon nitride films were deposited on the substrates 1 at 3.1 Å/min. The refractive index of the films was 1.771. The etching rate of the film using an etchant of HF was 3.75 Å/second. Absorption of IR light at 880 cm$^{-1}$ indicative of the existence of the bond Si—N was observed, while there was not observed light absorption at 1100 cm$^{-1}$ indicative of Si—O. This experiment was repeated on lead frames on which IC chips were mounted and connected thereto by wire bonding. As a result, excellent passivation films were formed.

When carbon coating is desired on a glass substrate, pre-coating of a silicon nitride film in advance of the carbon coating is particularly advantageous. The adhesivity of carbon films to a glass substrate is generally poor because of interaction between the glass substrate and the carbon film. During long use, carbon and oxygen contained in the glass substrate may react to produce gaseous COx at the interface and cause peeling off of the carbon film from the glass substrate.

In order to provide carbon coatings on a glass substrate with a sturdy mechanical contact, a silicon nitride film is first deposited on the glass substrate in accordance with the preceding example to a thickness of 100 to 1000 Å, and then a carbon coating is deposited on the silicon nitride film in accordance with the foregoing example to a thickness of 0.1 to 1 micrometer. According to experiments, no peeling was observed after carbon films on a glass substrate were kept at a relative humidity of 85% and 85° C. for 1000 hours.

Silicon oxide films can be deposited by use of monosilane, $N_2O$ and $N_2$ at a volume ratio of 1:3:10. By virtue of the first energy of 13.56 MHz and the second energy of 50 KHz, silicon oxide films were deposited at room temperature and at 300 to 1000 Å/min. The etching rate of the films using HF was about 50 Å/sec, which is about 5 times smaller than prior art figures. The IR light absorption spectrum of the films has a peak at 1100 cm$^{-1}$, indicating the existence of Si—O. Other deposition conditions were the same as the foregoing example for depositing silicon nitride films. After completing wire bonding of IC chips on a lead frame, a silicon oxide film was deposited to a thickness of 0.1 to 1 micrometer in this manner, followed by plastic moulding thereover. If phosphrous or boron is introduced, phosphorous or boron glass can be deposited.

An important application of carbon coating of the present invention is the photosensitive drum of electrostatic copying machines. A carbon coating of 100 to 500 Å thickness is deposited on an organic photoconductive film on the drum at room temperature.

The high thermal conductivity of carbon materials deposited in accordance with the present invention is effective when used as a heat sink. An example for coating carbon on the bottom of a silicon semiconductor wafer containing IC chips is described in the following. After formation of semiconductor devices within the wafer, a carbon film is deposited on the base thereof to a thickness of 0.5 to 5 micrometers. The wafer is then subjected to tests for examining the electric performance of the chips. The tested wafer is separated into individual chips. Each chip is mounted and electrically connected on a suitable board or a substrate by die bonding or wire bonding.

While a description has been made for several embodiments, the present invention should be limited only by the appended claims and should not be limited by the particualr examles, and there may be caused to artisan some modifications and variation according to the invention. For example, it has been proved effective to add boron, nitrogen, phosphorus or the like into the carbon. Also, when carbon material is deposited, a halogen gas or halogen compound gas, in addition to a hydrocarbon, is introduced into the reaction chamber. Examples of halogen compound gases are fluorine compounds such as $NF_3$, $SF_3$ and $WF_6$, chlorine compounds such as $CCl_4$, bromine compounds such as $CH_3Br$ and iodine compounds. The carbon material formed in accordance with the present invention contains a halogen at 0.1-50 atom % which is controlled by adjusting the introduction rate of the halogen compound gas.

Generally, the substrates to be coated in accordance with the present invention include surfaces made of metals, plastics, organic substances such as PET (polyethelene terephthalate), PES (polyethersulfone), PMMA (polymethyl methacrylate), TEFLON (registered trademark of DuPont), epoxy, polyimide and the like, and superconducting ceramics such as $YBaCU_3O_{6-8}$ and $BiSrCaCu_yO_x$.

We claim:

1. A plasma processing apparatus comprising a vacuum chamber, a gas introduction system for feeding a reactive gas into said vacuum chamber, a pair of electrodes provided in said vacuum chamber for generating plasma gas therebetween, a plurality of substrate holders arranged in subtantially parallel with the electric field induced between said electrodes in order not to provoke disturbance of the electric field, a first power source for applying first electric energy between said pair of electrodes and a second power source for applying second electric energy to said substrate holders.

2. The apparatus of claim 1 wherein said substrate holders are suspended from rails provided in said chamber.

3. The apparatus of claim 1 wherein said first power source is a transformer capable of outputting electric energy at 1 to 5000 MHz, wherein one terminal of a secondary coil is connected to one of said electrodes and another terminal of the secondary coil is connected to the other electrode.

4. The apparatus of claim 3 wherein one output terminal of said second power source is connected to a mid point of said secondary coil and the other terminal of said second powder source to said substrate holders.

5. The apparatus of claim 4 wherein the frequency of said second energy is 1 to 500 KHz.

6. The apparatus of claim 4 wherein said mid point is grounded.

* * * * *